(12) United States Patent
Banna et al.

(10) Patent No.: US 8,609,510 B1
(45) Date of Patent: Dec. 17, 2013

(54) REPLACEMENT METAL GATE DIFFUSION BREAK FORMATION

(71) Applicant: GLOBALFOUNDRIES Inc., Grand Cayman (KY)

(72) Inventors: Srinvasa Banna, San Jone, CA (US); Andy C. Wei, Queensbury, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/623,893

(22) Filed: Sep. 21, 2012

(51) Int. Cl.
*H01L 21/76* (2006.01)

(52) U.S. Cl.
USPC ........... 438/424; 438/197; 438/221; 438/270; 438/287; 438/291; 257/E21.409

(58) Field of Classification Search
None
See application file for complete search history.

(56) References Cited

U.S. PATENT DOCUMENTS

| | | |
|---|---|---|
| 7,888,233 B1 | 2/2011 | Gauri et al. |
| 2010/0296327 A1 | 11/2010 | Banna et al. |
| 2011/0303955 A1 | 12/2011 | Banna |
| 2013/0140639 A1* | 6/2013 | Shieh et al. ............ 257/368 |

* cited by examiner

*Primary Examiner* — Kyoung Lee
(74) *Attorney, Agent, or Firm* — Darrell L. Pogue; Keohane & D'Alessandro, PLLC

(57) ABSTRACT

Embodiments of the invention provide approaches for replacement metal gate (RMG) diffusion break formation. Specifically, a diffusion break is created after source/drain (S/D) formation, thereby allowing facet free and high quality S/D formation. A dummy gate body is removed selective to a sidewall section of a capping layer and a GOx layer formed over a substrate, and the opening is then extended through the GOx layer and into the substrate by etching the dummy gate body selective to the sidewall section of the capping layer. Retaining the capping layer during the dummy gate body etch enables the diffusion break to be self-aligned to the gate and eliminates device variability due to S/D volume variations. Processing then continues with RMG poly open chemical mechanical planarization (POC) and poly open planarization (POP).

20 Claims, 11 Drawing Sheets

REPLACEMENT METAL GATE DIFFUSION BREAK FORMATION

BACKGROUND

1. Technical Field

This invention relates generally to the field of semiconductors, and more particularly, to manufacturing approaches used in forming diffusion breaks during processing of integrated circuits and other devices.

2. Related Art

A typical integrated circuit (IC) chip includes a stack of several levels or sequentially formed layers of shapes. Each layer is stacked or overlaid on a prior layer and patterned to form the shapes that define devices (e.g., field effect transistors (FETs)) and connect the devices into circuits. In a typical state of the art complementary insulated gate FET process, such as what is normally referred to as CMOS, layers are formed on a wafer to form the devices on a surface of the wafer. Further, the surface may be the surface of a silicon layer on a silicon on insulator (SOI) wafer. A simple FET is formed by the intersection of two shapes, a gate layer rectangle on a silicon island formed from the silicon surface layer. Each of these layers of shapes, also known as mask levels or layers, may be created or printed optically through well known photolithographic masking, developing and level definition, e.g., etching, implanting, deposition and etc.

Mask shapes each may be grouped into one of four types: line/space arrays, isolated lines, isolated spaces, and contact holes. Ideally, fabrication parameters such as process biases applied to features on a particular layer affects all types of features uniformly on that layer. Unfortunately, all feature types do not respond uniformly. In particular, isolated lines and minimum pitch line/space arrays known as contact pitch lines behave differently to focus. Contacted pitch lines are minimum pitch line/space arrays on a particular layer in the minimum line width and spacing plus additions for via or contact covers or landing pads. When printed out-of-focus, contact pitch lines get wider (and spaces shrink), while isolated lines get narrower. This dichotomy has become especially troublesome, as image dimensions have shrunk.

As shown in FIG. 1, an exemplary current art device 10 has a diffusion break 12 formed beneath the dummy gate 14 of device 10 prior to source/drain formation. However, at the 20 nm technology node and beyond, this approach suffers from one or more of the following deficiencies: a) poor source/drain growth at active region (Rx) and Fin edge, b) contact (CA) punch-through at Rx and Fin ends, and c) device variability. Furthermore, existing solutions either increase standard cell width by at least 1 contacted poly pitch (CPP), or are not capable of ensuring adequate coverage for Rx and Fin tuck, thus costing device yield and performance. Therefore, what is needed is an approach that solves one or more deficiencies of the current art.

SUMMARY

In general, embodiments of the invention provide approaches for replacement metal gate (RMG) diffusion break formation. Specifically, a diffusion break is created after source/drain (S/D) formation, thereby allowing facet free and high quality S/D formation. A dummy gate body is removed selective to a capping layer and a GOx layer formed over a substrate, and the opening is then extended through the GOx layer and into the substrate by etching the dummy gate body selective to a sidewall section of the capping layer. Retaining the capping layer during the dummy gate body etch enables the diffusion break to be self-aligned to the gate and eliminates device variability due to S/D volume variations. Processing then continues with RMG poly open chemical mechanical planarization (POC) and poly open planarization (POP).

One aspect of the present invention includes a method for forming a device, the method comprising: providing a set of gate structures and a dummy gate structure over a substrate containing souce/drain regions formed therein; removing an inter poly dielectric (IPD) oxide atop the dummy gate structure and atop the set of gate structures selective to a capping layer; removing the capping layer atop the dummy gate body and atop a gate body of each of the set of gate structures; depositing a first oxide layer over the dummy gate structure and the set of gate structures; forming an opening in the first oxide layer over the dummy gate structure; extending the opening into the substrate; filling the opening with an oxide fill material; removing the first oxide layer and the oxide fill material selective to a gate body of each of the set of gate structures; and removing the gate body of each of the set of gate structures.

Another aspect of the present invention includes a method of forming a diffusion break in a device, the method comprising: providing a set of gate structures and a dummy gate structure over a substrate containing souce/drain regions formed therein; forming a first oxide layer over the set of gate structures and the dummy gate structure; forming an opening in the first oxide layer over the dummy gate structure; removing the dummy gate body selective to a capping layer and a GOx layer formed over the substrate; extending the opening through the GOx layer and into the substrate; filling the opening with an oxide fill material; removing the first oxide layer and the oxide fill material selective to a gate body of each of the set of gate structures; and removing the gate body of each of the set of gate structures.

Another aspect of the present invention includes a method for forming a diffusion break, the method comprising: providing a set of gate structures and a dummy gate structure over a substrate containing a set of embedded source/drain regions and a set of doped wells formed therein; removing a capping layer from atop a dummy gate body of the dummy gate structure and atop a gate body of each of the gate structures; forming a first oxide layer over the set of gate structures and the dummy gate structure; forming an opening in the first oxide layer over the dummy gate structure; removing the dummy gate body selective to the capping layer; extending the opening into the substrate selective to a sidewall section of the capping layer; filling the opening with an oxide fill material; removing the first oxide layer and the oxide fill material selective to a gate body of each of a set of gate structures; and removing the gate body of each of the set of gate structures.

BRIEF DESCRIPTION OF THE DRAWINGS

These and other features of this invention will be more readily understood from the following detailed description of the various aspects of the invention taken in conjunction with the accompanying drawings in which.

Figure 1:
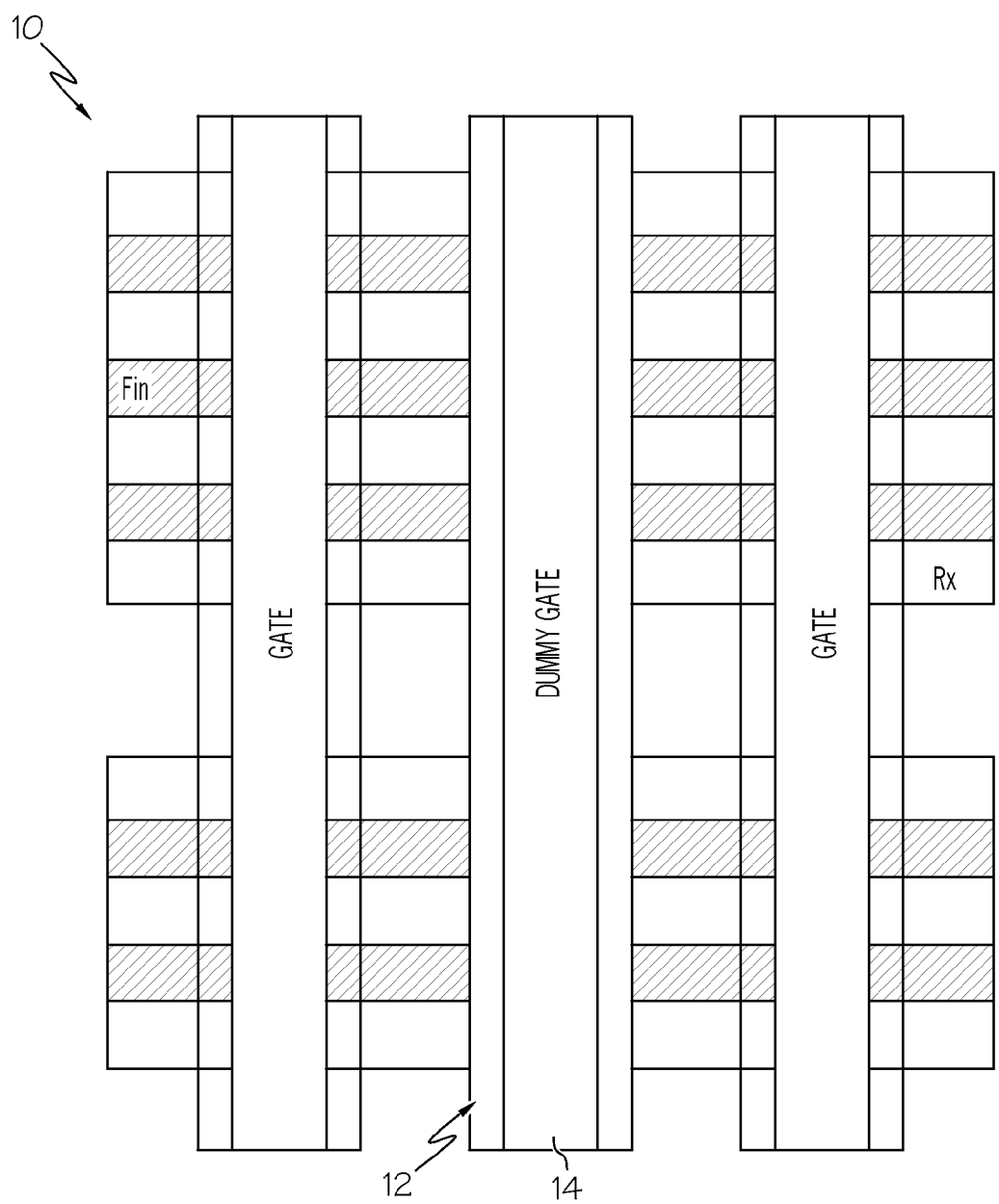
FIG. 1 shows a top-view of a prior art semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. Described are methods and techniques used in forming a diffusion break during replacement metal gate (RMG) formation. Specifically, exemplary embodiments provide approaches for creating the diffusion break after source/drain (S/D) formation, thereby allowing facet free and high quality S/D formation. A dummy gate body is removed selective to a capping layer and a GOx layer formed over a substrate, and an opening is then extended through the GOx layer and into the substrate by etching the dummy gate body selective to a sidewall section of the capping layer. Retaining the capping layer during the dummy gate body etch enables the diffusion break to be self-aligned to the gate and eliminates device variability due to S/D volume variations. Processing then continues with RMG poly open chemical mechanical planarization (POC) and poly open planarization (POP).

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

Figure 2:
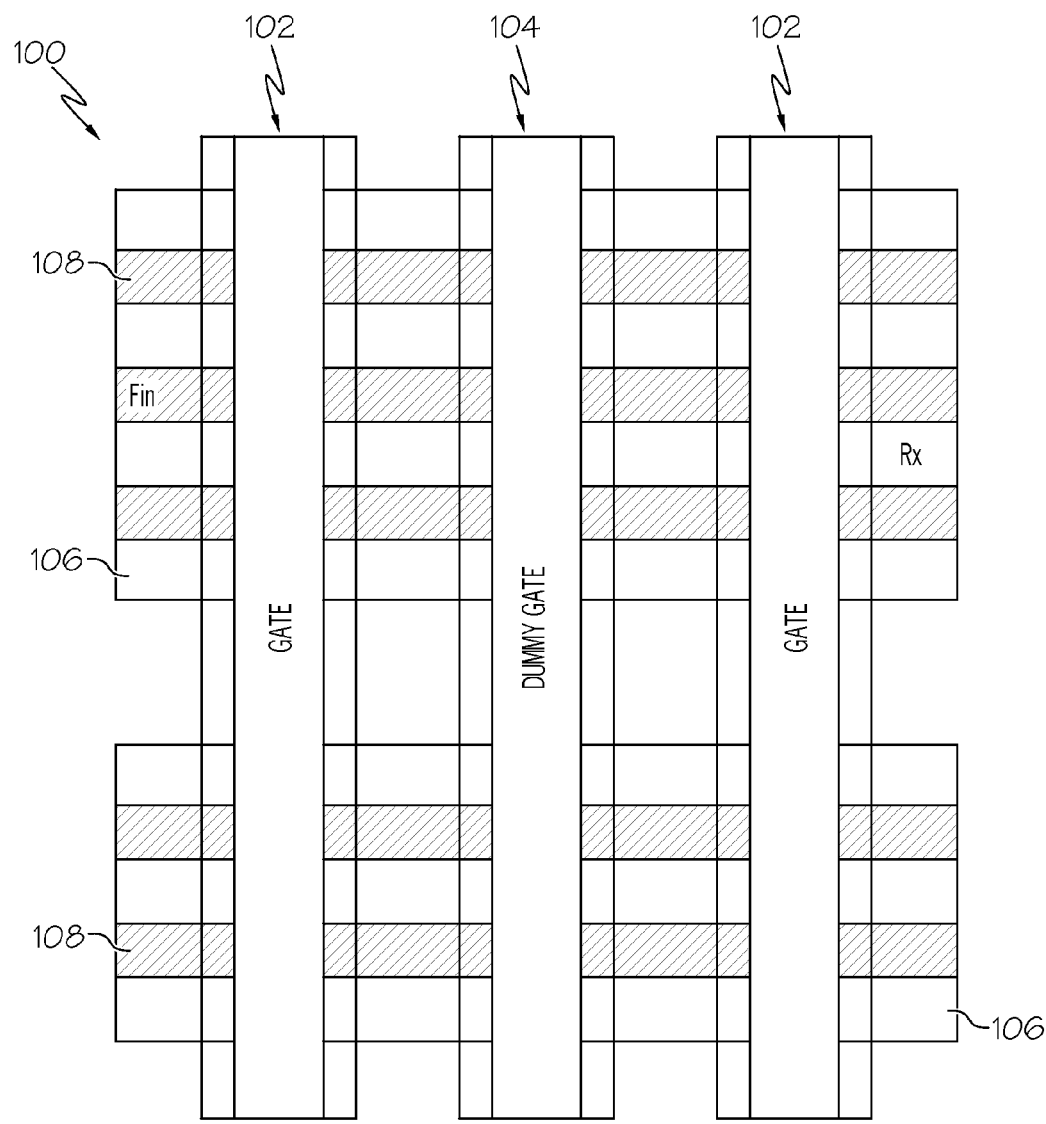
FIG. 2 shows a top view of a device having no diffusion break under a dummy gate prior to S/D formation according to illustrative embodiments.

With reference again to the figures, FIG. 2 shows a top view of a device 100 according to illustrative embodiments. Device 100 comprises a layered integrated circuit (IC) structure including a set of gate structures 102 and a dummy gate structure 104 formed over a plurality of active regions 106 and a plurality of fins 108. Unlike the prior art approach depicted in FIG. 1, the exemplary device 100 shown in FIG. 2 has no diffusion break under dummy gate 104 at this stage of processing (i.e., following S/D formation). Instead, as will be shown and described in more detail below, the diffusion break is created after S/D Epi and inter poly dielectric (IPD) oxide planarization, and during RMG poly open chemical mechanical planarization (CMP) and RMG poly open planarization.

Although not specifically shown, embodiments described herein also apply to planar technology, which consists of the selective introduction of dopant atoms into small areas of the silicon wafer from the top surface of the wafer in order to form regions of n-type and p-type material. This technology is called planar because fabrication is accomplished by processes carried out from one surface plane.

Figure 3:
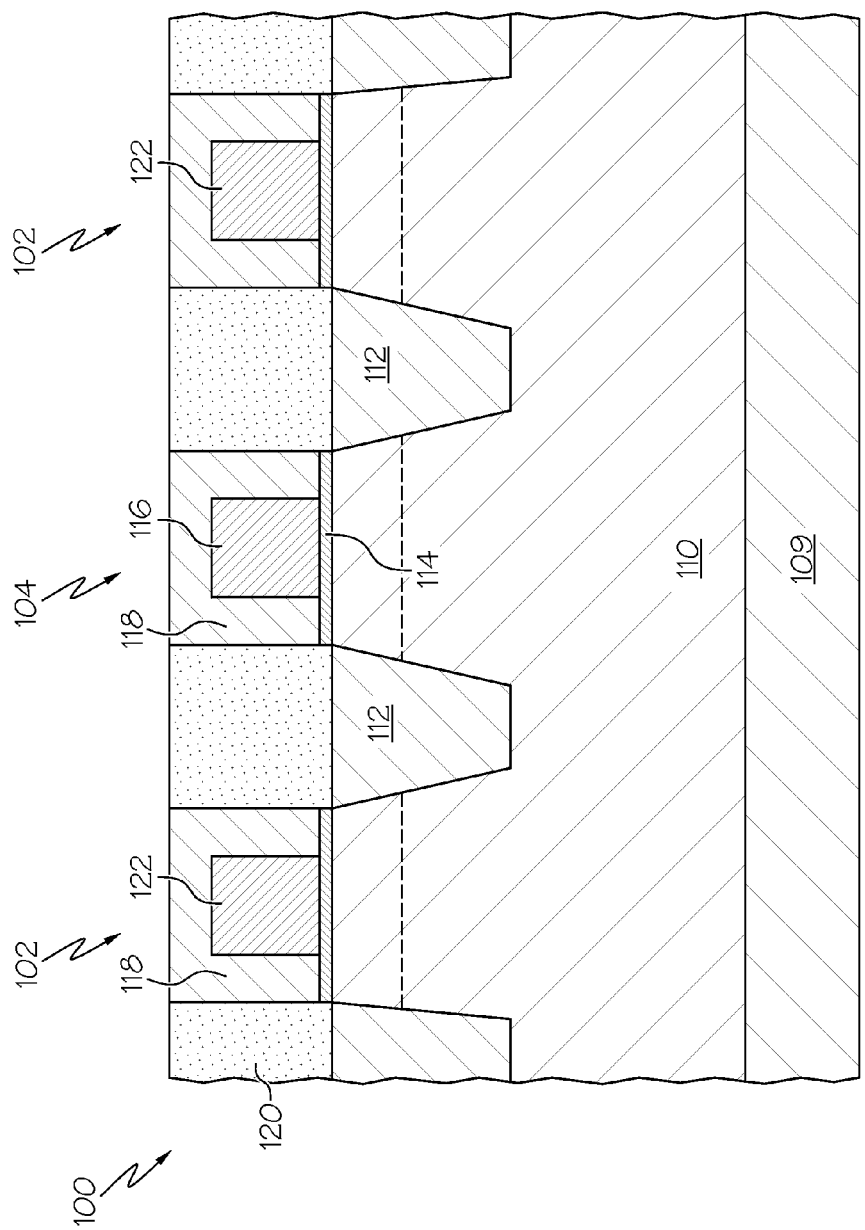
FIG. 3 shows a cross-sectional view of the device following an inter poly dielectric (IPD) oxide deposition and a planarization process according to illustrative embodiments.

Referring now to FIG. 3, a side view of device 100 will be described in further detail. In exemplary embodiments, device 100 includes gate structures 102 and dummy gate structure 104 formed over a dielectric layer 108, and a doped well 110 (e.g., N-well) containing S/D regions 112 (e.g., embedded silicon germanium containing carbon (eSiGe) for pFETs and embedded silicon-carbon (eSiC) for nFETs) formed therein. Dummy gate structure 104 has a dummy gate body 116 and a capping layer 118 formed over top and sidewall surfaces of dummy gate body 116. Similarly, each gate structure 102 includes a gate body 122 covered by capping layer 118. Dummy gate body 116 and gate body 122 may include any now known or later developed material appropriate for holding a position within a dielectric layer. In exemplary embodiments, dummy gate body 116 includes a polysilicon. Device 100 further includes a GOx layer 114, which may include, for example, silicon oxide ($SiO_2$) and/or silicon oxynitride ($SiO_xN_y$), etc. In one embodiment, GOx layer 114 includes a low density oxide, e.g., <1.9 grams per cubic centimeter (g/cc). Capping layer 118 may be formed using conventional techniques, for example, deposition of silicon nitride ($Si_3N_4$) and reactive ion etching. Device 100 further includes IPD oxide 120, which has been deposited and then removed (e.g., using CMP) over dummy gate structure 104 and gate structures 102 selective to capping layer 118, resulting in device 100 shown in FIG. 3.

Many processes are well known in the art of device manufacturing that are capable of forming a gate layer, which is subsequently processed to form dummy gate body 116 and gate body 122, and this invention is not limited as to a particular process. Although dummy gate body 116 and gate body 122 are not limited as to a particular material, the presently preferred gate layer is formed from a poly-silicon. Many processes of forming doped poly-silicon are known in the art, and the invention is not limited as to a particular process. For example, poly-silicon can be deposited using plasma deposition or thermal decomposition. Also, doping can be accomplished in-situ or by external doping. Examples of external doping including implanting and diffusion of both n+ type and p+ type dopants. In a preferred embodiment, the gate layer is formed in-situ with a phosphorus dopant using silane.

Substrate 109 may be any silicon containing substrate including, but not limited to Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment, when substrate 109 is a silicon-on-insulator (SOI) or SiGe-on-insulator (SGOI) substrate, the thickness of the semiconducting Si-containing layer atop the buried insulating layer (not shown) may be 10 nm or greater. In one embodiment, the SOI or SGOI substrate may be fabricated using a thermal bonding process, or alternatively be fabricated by an ion implantation process, such as separation by ion implantation of oxygen (SIMOX).

As used herein, "depositing" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 4:
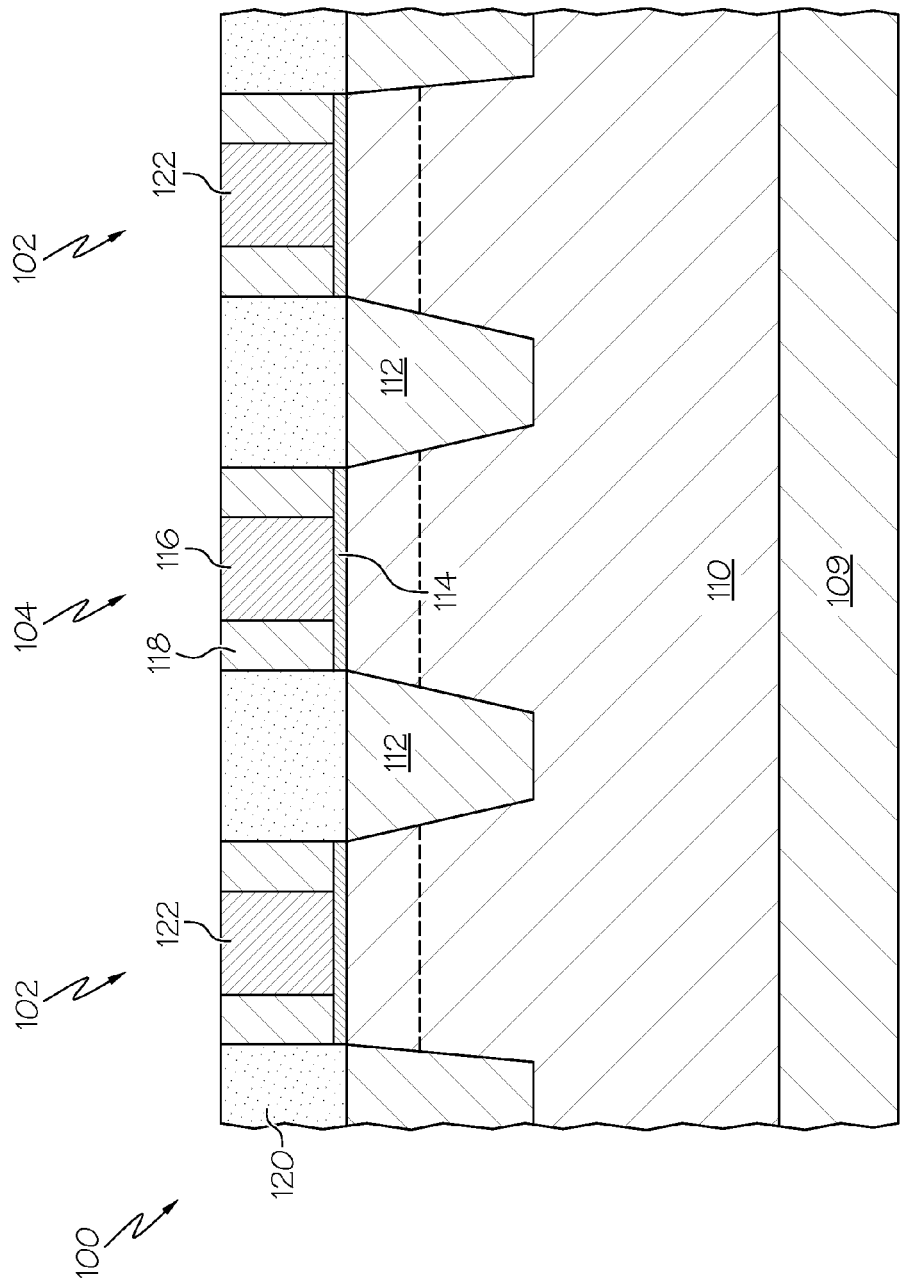
FIG. 4 shows a cross-sectional view of the device following a planarization removal process according to illustrative embodiments.

Next, as shown in FIG. 4, capping layer 118 is removed from atop dummy gate body 116 and gate body 122. In exemplary embodiments, IPD oxide 120 between gates 102 and dummy gate 104, and capping layer 118 over each gate body, are removed via CMP. As understood to those skilled in the art, the CMP process involves contacting a material layer to be polished with a rotating polishing pad. An abrasive slurry comprising an abrasive suspended in an aqueous solution, which may also contain chemical constituents to achieve selectively, is disposed between the polishing pad and the material layer to be polished. The material layer to be polished is then polished away with the polish pad and slurry to achieve a desired removal. In exemplary embodiments, the CMP is non-selective to IPD oxide 120 and nitride of capping layer 118, but selective to polysilicon of gate bodies 122 and dummy gate body 116. As such, the CMP slows down when it reaches the polysilicon of gate bodies 122 and dummy gate body 116. Etching of IPD oxide 120 between gates similarly slows down due to the selectivity to polysilicon.

Figure 5:
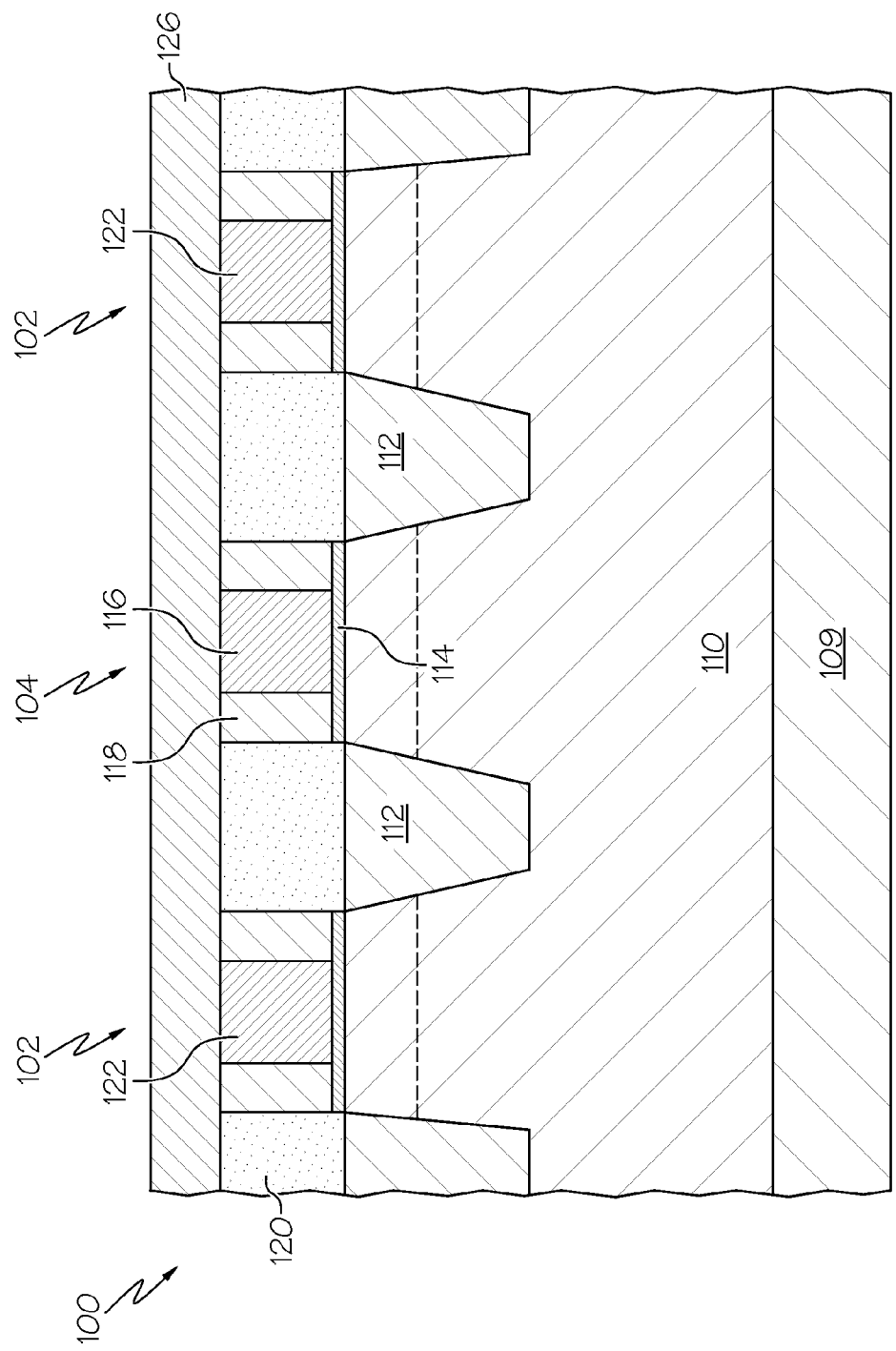
FIG. 5 shows a cross-sectional view of the device following deposition of a first oxide layer according to illustrative embodiments.

Next, as shown in FIG. 5, a first oxide layer 126 is deposited over dummy gate structure 104 and gate structures 102. In exemplary embodiments, first oxide layer 126 includes tetra-ethyl-ortho silicate (TEOS) oxide and is deposited with a target thick enough for removal of GOx layer 114 beneath dummy gate structure 104 plus margin, as will be shown and described in further detail below.

Figure 6:
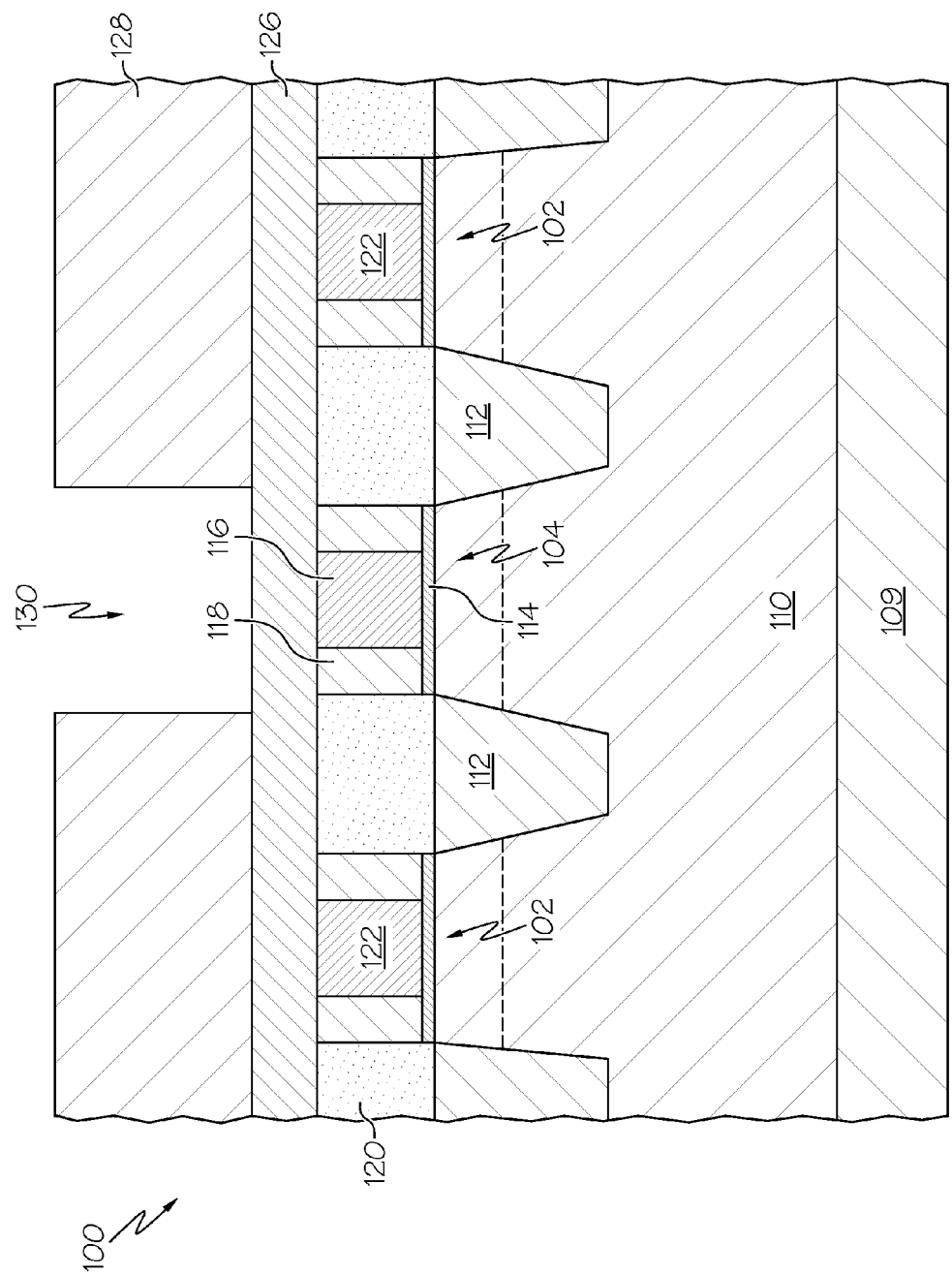
FIG. 6 shows a cross-sectional view of the device during a masking and patterning process according to illustrative embodiments.

First oxide layer 126 is then patterned and etched to form an opening therein. To accomplish this, as shown in FIG. 6, a masking structure 128 is first formed over first oxide layer 126, and an opening 130 in masking structure 128 is then patterned, for example, using a photo-lithography processes or other lithographic process (e.g., electron beam lithography, imprint lithography, etc.). In exemplary embodiments, opening 130 is patterned in masking structure 128 over dummy gate structure 104, as shown.

In one non-limiting example, masking structure 128 is formed on the top surface of an anti-reflective layer (not shown), for example, by spin coating. Masking structure 128 includes a material that is photosensitive at a wavelength range. For example, masking structure 128 may include a deep ultraviolet (DUV) photoresist, a mid-ultraviolet (MUV) photoresist, an extreme ultraviolet (EUV) photoresist, or an electron beam (e-beam) photoresist. The material of masking structure 128 reacts to illumination and is chemically changed, for example, by cross-linking, in the wavelength range within which masking structure 128 is photosensitive. Masking structure 128 may include a variety of types of masking structures. In one embodiment, masking structure 128 comprises refractive or reflective masking structures including, for example, optical, extreme ultraviolet (EUV), and/or x-ray technologies. An optical masking structure may generally include materials such as quartz or various types of silica including fused silica and chrome, chrome oxide, and/or chrome oxynitride or molybdenum silicide, but may include other materials in other embodiments. An EUV masking structure may include a ruthenium (Ru) capped molybdenum silicon (MoSi) multilayer blank among other materials and/or structures. EUV masking structures may also comprise a low thermal expansion material (LTEM). Masking structure 128 may be used in immersion technologies in other embodiments.

Figure 7:
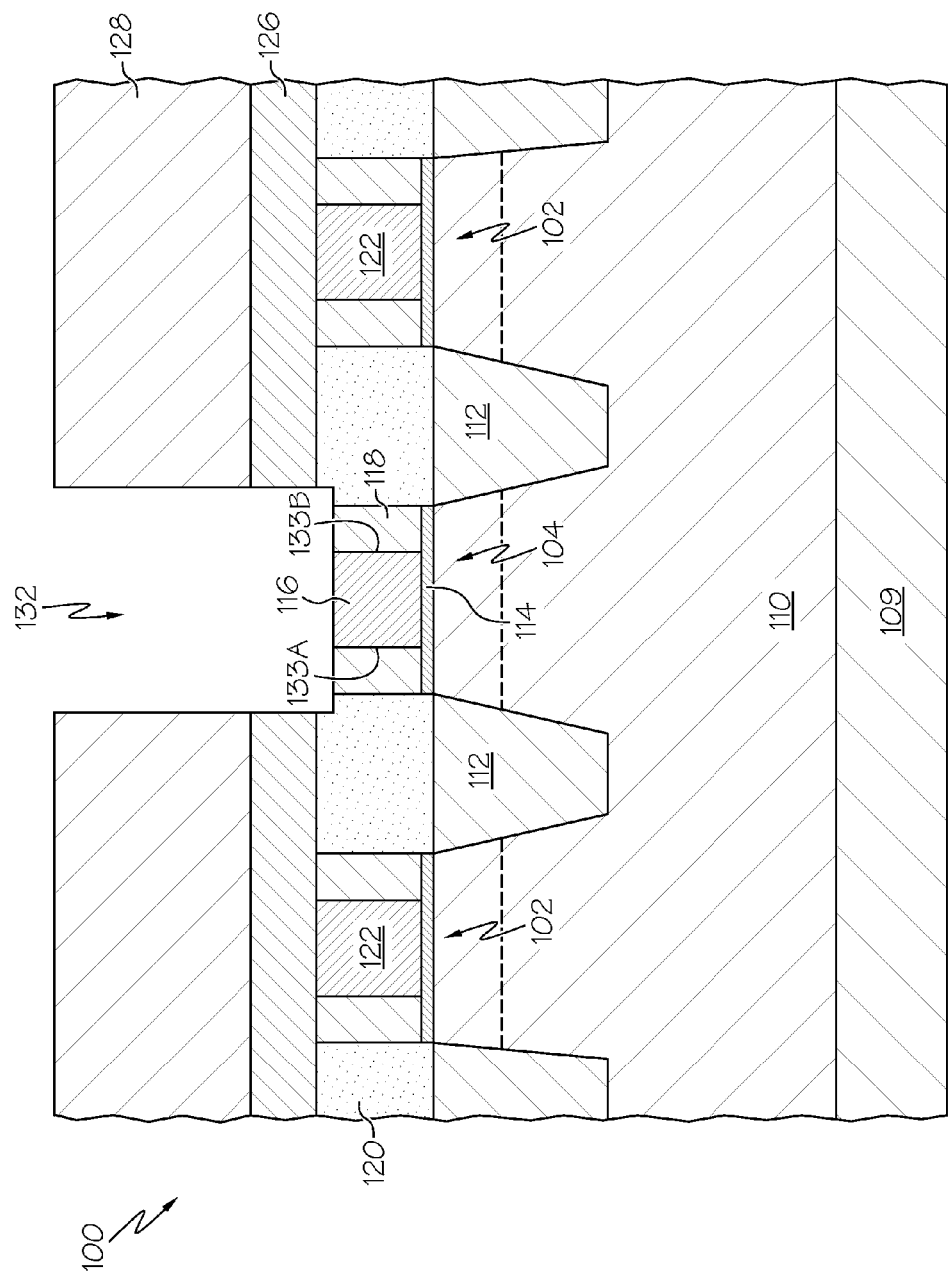
FIG. 7 shows a cross-sectional view of the device following formation of an opening in the first oxide layer according to illustrative embodiments.

Next, as shown in FIG. 7, an opening 132 is formed in first oxide layer 126 over dummy gate structure 104. In exemplary embodiments, opening 132 is formed in first oxide layer 126 by etching selective to a sidewall portion of capping layer 118 remaining on sidewalls 133A and 133B of dummy gate body 116. In some cases, first oxide layer 126 etch polymerization will consume a small portion of capping layer 118 and dummy gate body 116, as shown.

Figure 8:
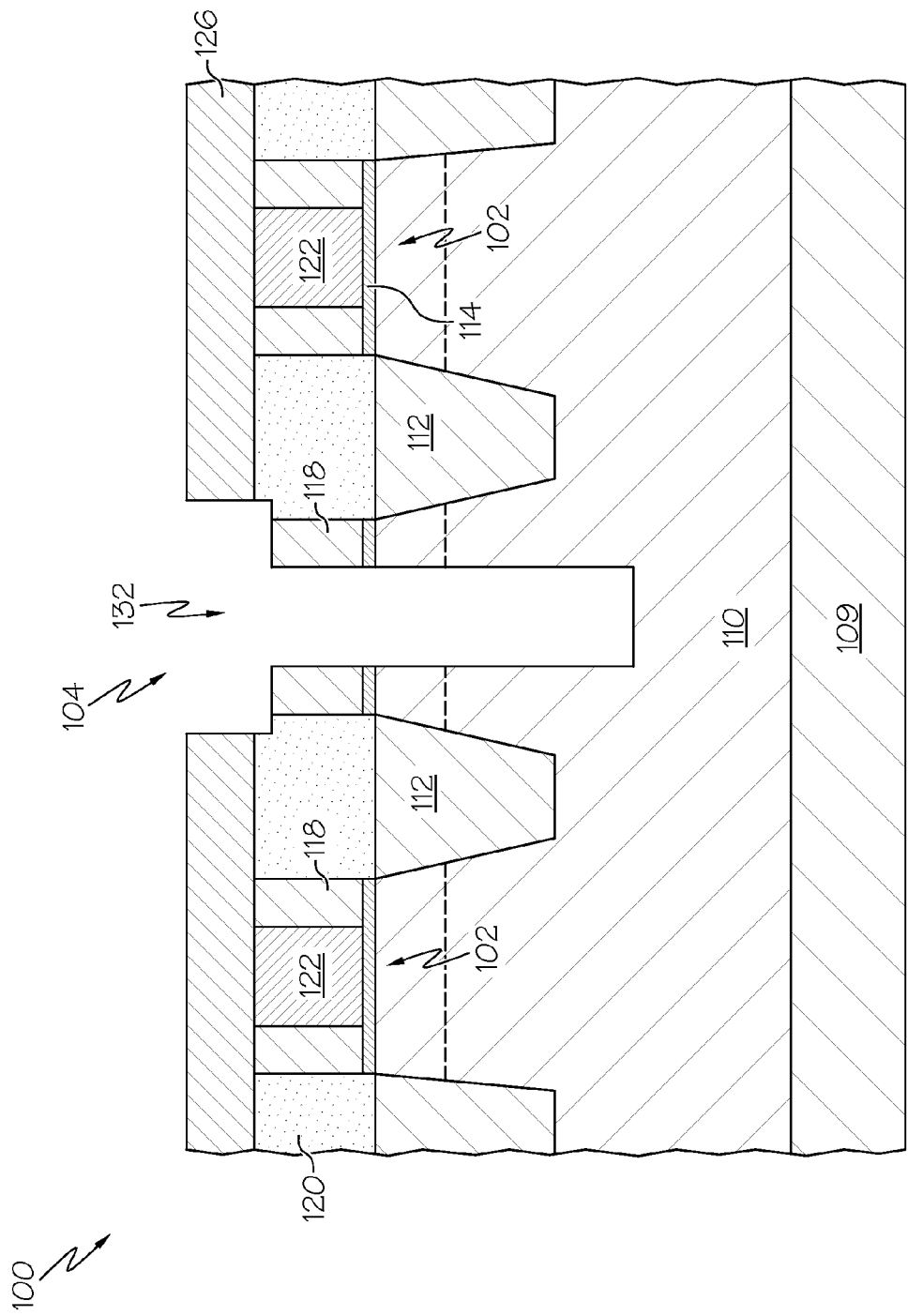
FIG. 8 shows a cross-sectional view of the device following formation of an opening through the dummy gate and into the substrate.

Next, opening 132 is extended into N-well 109, as shown in FIG. 8. In exemplary embodiments, opening 132 is extended by etching dummy gate body 116 selective to the sidewall portion of capping layer 118 and GOx layer 114, e.g., using an appropriate polysilicon etching technique. In one embodiment, dummy gate body 116 is removed by performing a wet etch selective to GOx layer 114. For example, where dummy gate body 116 includes polysilicon, the wet etch may use ammonium hydroxide. Other examples include tetra methyl ammonia hydroxide (TMAH), warm or hot ammonia, or hot tetra ethyl ammonia hydroxide (TEAH). GOx layer 114 is then removed using an oxide etch, and opening 132 continues into N-well 110 by etching (e.g., a polysilicon wet etch) selective to capping layer 118, IPD 120, and until a desired depth is achieved.

Figure 9:
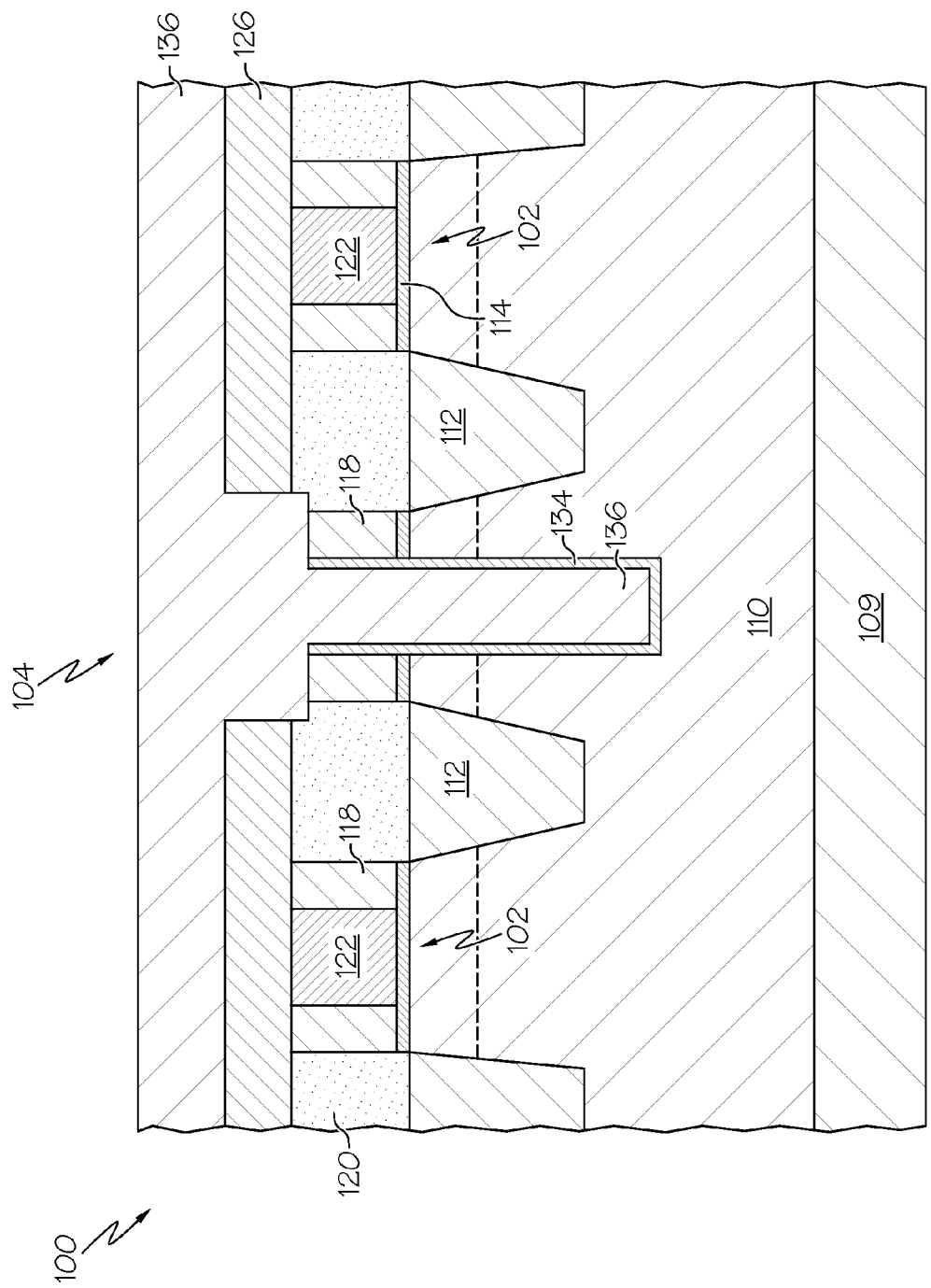
FIG. 9 shows a cross-sectional view of the device following deposition of an oxide fill material according to illustrative embodiments.

Next, as shown in FIG. 9, opening 132 is filled with an oxide fill material, e.g., via a flowable chemical vapor deposition (FCVD) fill process. In exemplary embodiments, opening 132 (FIG. 8) is filled by first forming a liner 134 within opening 132, and then depositing oxide fill material 136 over first oxide layer 126 and liner 134 using FCVD. Specifically, a soft jelly-like liquid or flowable film is deposited into opening 132 and then converted into a solid silicon oxide film. This process enables void-free gap-fill in reduced sized features with high aspect ratios, and may reduce or eliminate the need for certain etch steps.

Figure 10:
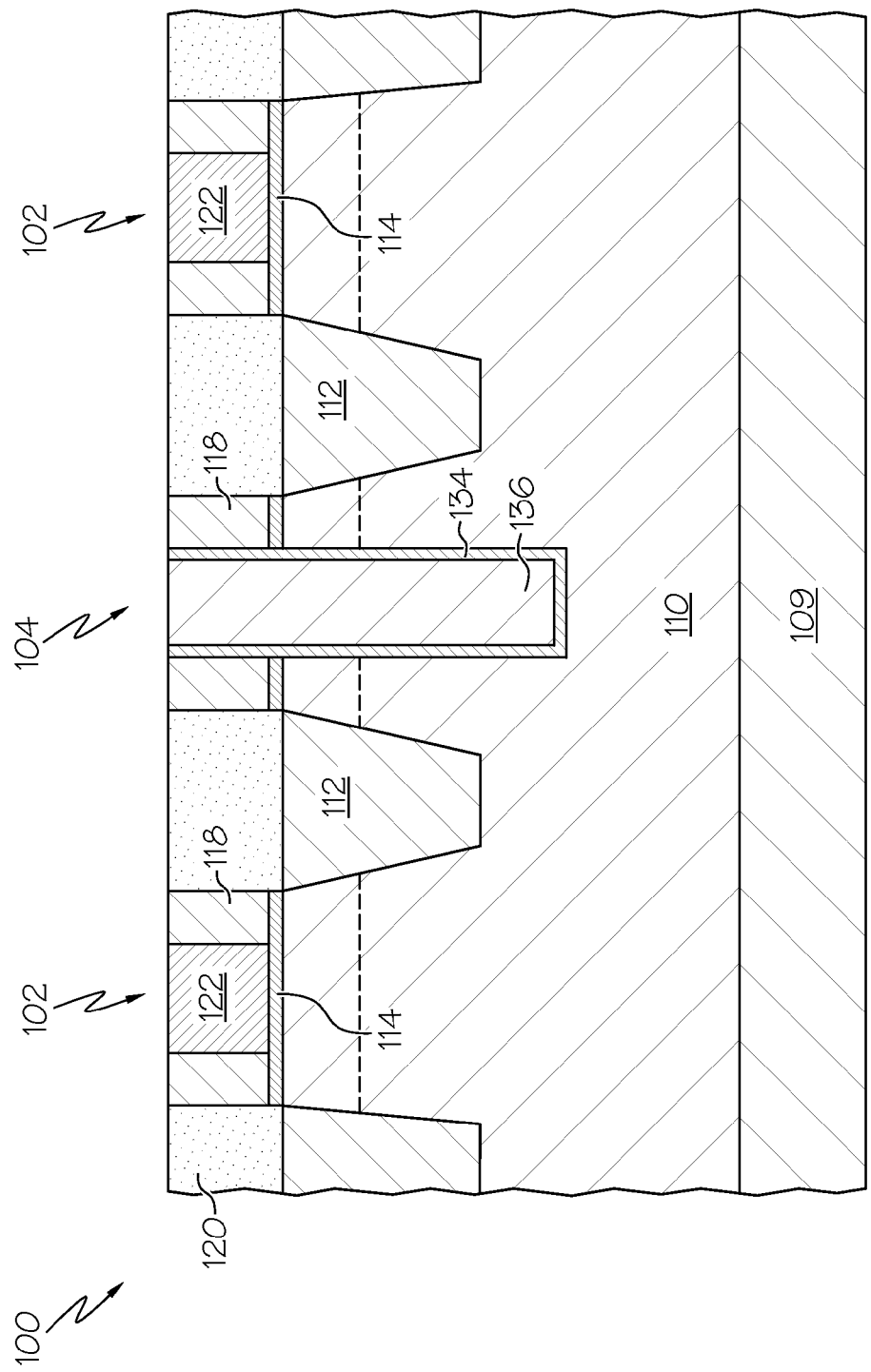
FIG. 10 shows a cross-sectional view of the device following a planarization of the oxide fill material according to illustrative embodiments.
Figure 11:
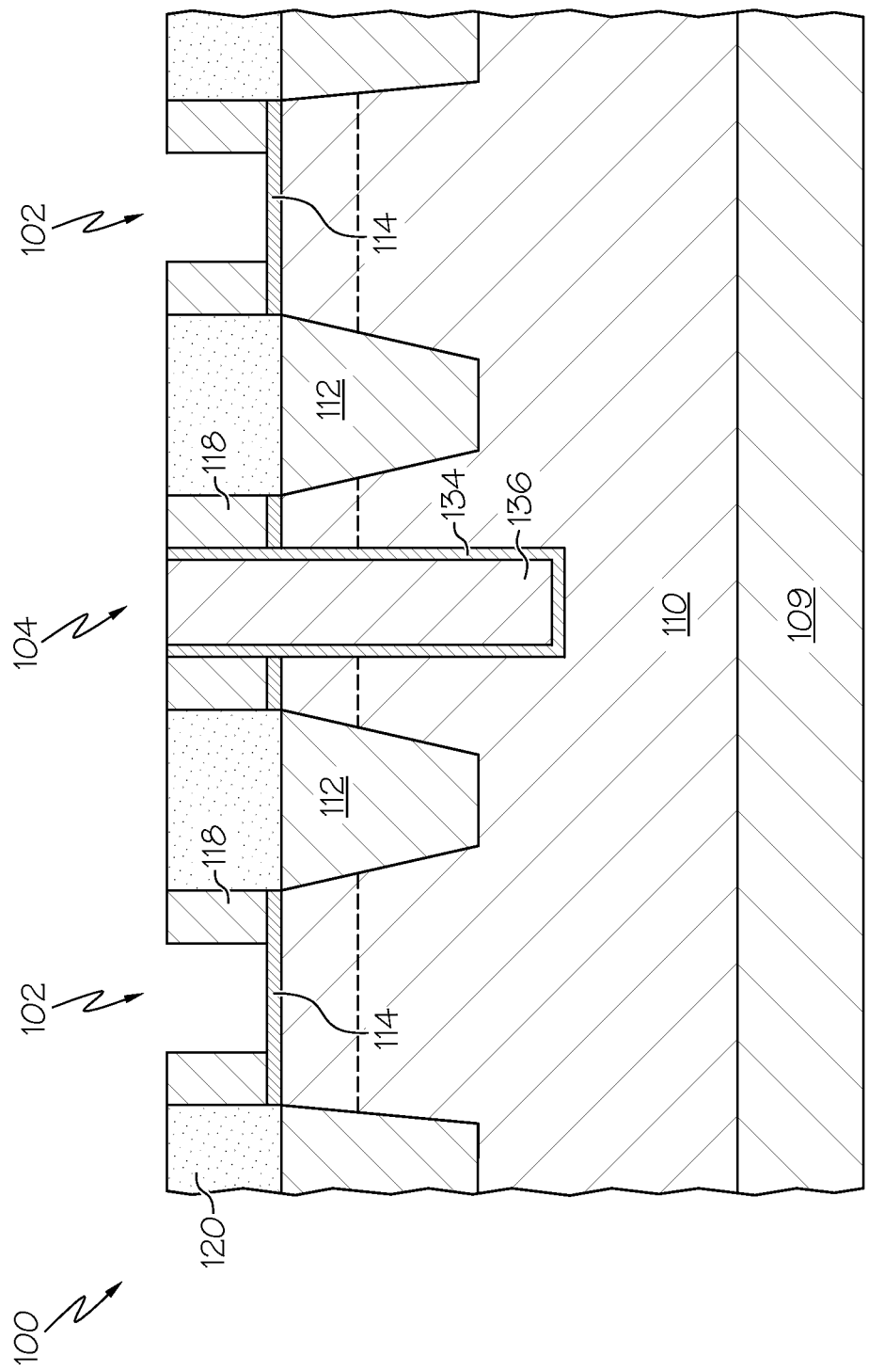
FIG. 11 shows a cross-sectional side view of the device following removal of a set of gate bodies according to illustrative embodiments.

Next, as shown in FIG. 10, the first oxide layer 126 and oxide fill material 136 are removed selective to gate body 122 of each gate structure 102 during a poly open CMP (POC) process. The oxide layers are removed down to and exposing polysilicon gate bodies 122. RMG poly open processing (POP) continues in FIG. 11, wherein gate bodies 122 (FIG. 10) are removed via a dry etch selective to GOx layer 114 and capping layer 118, and an optional tetramethylammonium hydroxide (TMAH) cleanup is performed.

Finally, although not shown, gate bodies 122 are replaced by metal electrodes having desirable electrical characteristics, or replaced with polysilicon, which may be salicided to achieved desirable electrical characteristics, as known to those skilled in the art.

In various embodiments, design tools can be provided and configured to create the datasets used to pattern the semiconductor layers as described herein. For example data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that there has been provided approaches for RMG diffusion break formation. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
   providing a set of gate structures and a dummy gate structure over a substrate containing souce/drain regions formed therein;
   removing an inter poly dielectric (IPD) oxide over the dummy gate structure and the set of gate structures selective to a capping layer;
   removing the capping layer atop a dummy gate body of the dummy gate structure and atop a gate body of each of the set of gate structures;
   depositing a first oxide layer over the dummy gate structure and the set of gate structures;
   forming an opening in the first oxide layer over the dummy gate structure;
   extending the opening into the substrate;
   filling the opening with an oxide fill material;
   removing the first oxide layer and the oxide fill material selective to a gate body of each of the set of gate structures; and
   removing the gate body of each of the set of gate structures.

2. The method according to claim 1, further comprising:
   providing a gate oxide (GOx) layer over the substrate; and
   providing the IPD oxide over the GOx layer, the dummy gate structure, and the set of gate structures.

3. The method according to claim 1, further comprising:
   forming a masking structure over the first oxide layer; and
   patterning an opening in the masking structure over the dummy gate structure.

4. The method according to claim 1, the forming the opening in the first oxide layer comprising etching the first oxide layer selective to a sidewall section of the capping layer covering a pair of sidewalls of the dummy gate body.

5. The method according to claim 4, the extending the opening into the substrate comprising:
   etching the dummy gate body selective to the sidewall section of the capping layer and the GOx layer;
   etching the GOx layer; and
   etching the substrate.

6. The method according to claim 1, the filling the opening comprising:
   forming a liner in the opening; and
   depositing the oxide fill material over the first oxide layer and the liner using a flowable chemical vapor deposition (FCVD) process.

7. The method according to claim 1, the first oxide layer comprising a tetra-ethyl-ortho-silicate (TEOS) oxide.

8. The method according to claim 1, the removing the gate body of each of the set of gate structures comprising performing a poly open polishing (POP) process.

9. The method according to claim 1, the souce/drain regions comprising one of: embedded silicon germanium, and embedded silicon-carbon.

10. A method for forming a diffusion break in a device, the method comprising:
    providing a set of gate structures and a dummy gate structure over a substrate containing souce/drain regions formed therein;
    forming a first oxide layer over the set of gate structures and the dummy gate structure;

forming an opening in the first oxide layer over the dummy gate structure, the first oxide layer formed over the set of gate structures and the dummy gate structure;

removing the dummy gate body selective to a capping layer and a GOx layer formed over the substrate;

extending the opening through the GOx layer and into the substrate;

filling the opening with an oxide fill material;

removing the first oxide layer and the oxide fill material selective to a gate body of each of the set of gate structures; and removing the gate body of each of the set of gate structures.

11. The method according to claim 10, further comprising providing an IPD oxide over the GOx layer, the dummy gate structure, and the set of gate structures.

12. The method according to claim 11, further comprising:

removing the inter poly dielectric (IPD) oxide over the dummy gate structure and the set of gate structures selective to the capping layer;

removing the capping layer atop the dummy gate body and atop the gate body of each of the set of gate structures; and depositing the first oxide layer over the dummy gate structure and the set of gate structures.

13. The method according to claim 10, further comprising:

forming a masking structure over the first oxide layer; and patterning an opening in the masking structure over the dummy gate structure.

14. The method according to claim 10, the forming the opening in the first oxide layer comprising etching the first oxide layer selective to a sidewall section of the capping layer covering a pair of sidewalls of the dummy gate body.

15. The method according to claim 14, the extending the opening into the substrate comprising:

etching the dummy gate body selective to the sidewall section of the capping layer and the GOx layer;

etching the GOx layer; and etching the substrate.

16. The method according to claim 10, the filling the opening comprising:

forming a liner in the opening; and depositing the oxide fill material over the first oxide layer and the liner using a flowable chemical vapor deposition (FCVD) process.

17. The method according to claim 10, the first oxide layer comprising a tetra-ethyl-ortho-silicate (TEOS) oxide.

18. The method according to claim 10, the removing the gate body of each of the set of gate structures comprising performing a poly open polishing (POP) process.

19. The method according to claim 10, the souce/drain regions comprising one of: embedded silicon germanium, and embedded silicon-carbon.

20. A method for forming a diffusion break, the method comprising:

providing a dummy gate structure and a set of gate structures over a substrate containing a set of embedded source/drain regions and a set of doped wells formed therein;

removing a capping layer from atop a dummy gate body of the dummy gate structure and atop a gate body of each of the set of gate structures;

forming a first oxide layer over the set of gate structures and the dummy gate structure;

forming an opening in the first oxide layer over the dummy gate structure;

removing the dummy gate body selective to the capping layer;

extending the opening into the set of doped wells;

filling the opening with an oxide fill material;

removing the first oxide layer and the oxide fill material selective to a gate body of each of a set of gate structures; and removing the gate body of each of the set of gate structures.

* * * * *